United States Patent
Wang et al.

(10) Patent No.: US 9,972,615 B1
(45) Date of Patent: May 15, 2018

(54) SEMICONDUCTOR DEVICE FOR ELECTROSTATIC DISCHARGE PROTECTION

(71) Applicant: UNITED MICROELECTRONICS CORP., Hsin-Chu (TW)

(72) Inventors: Jhih-Ming Wang, Yunlin County (TW); Li-Cih Wang, Taoyuan (TW); Tien-Hao Tang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/351,413

(22) Filed: Nov. 14, 2016

(51) Int. Cl.
| | |
|---|---|
| *H01L 27/02* | (2006.01) |
| *H01L 29/06* | (2006.01) |
| *H01L 29/08* | (2006.01) |
| *H01L 29/10* | (2006.01) |
| *H01L 29/78* | (2006.01) |

(52) U.S. Cl.
CPC ...... *H01L 27/0266* (2013.01); *H01L 27/0262* (2013.01); *H01L 29/0619* (2013.01); *H01L 29/0649* (2013.01); *H01L 29/0847* (2013.01); *H01L 29/1095* (2013.01); *H01L 29/7835* (2013.01)

(58) Field of Classification Search
None
See application file for complete search history.

(56) References Cited

U.S. PATENT DOCUMENTS

| | | | |
|---|---|---|---|
| 8,643,111 B1 | 2/2014 | Jou | |
| 8,896,024 B1* | 11/2014 | Chen | H01L 27/0262 257/173 |
| 2009/0008710 A1* | 1/2009 | Wei | H01L 29/0696 257/337 |
| 2010/0301411 A1* | 12/2010 | Takeda | H01L 29/0696 257/335 |
| 2013/0093009 A1* | 4/2013 | Chen | H01L 29/41758 257/335 |

OTHER PUBLICATIONS

Tai, Title of Invention: Semiconductor Device for Electrostatic Discharge Protection, U.S. Appl. No. 15/188,962, filed Jun. 21, 2016.

* cited by examiner

Primary Examiner — Erik Kielin
(74) Attorney, Agent, or Firm — Winston Hsu

(57) ABSTRACT

A semiconductor device for ESD protection, includes a drain region, a first doped region, a second doped region and a source region. The drain region is disposed in a substrate at a first side of a gate and the drain region has a first conductivity type. The first doped region is disposed in a second doped well at a second side of the gate and has a second conductivity type. The source region is also disposed in the second doped well and has the first conductive type, and the source region surrounds the first doped region from a topview. The second doped region is disposed in the second doped well and has the second conductive type, and the second doped region is disposed between the gate and the source region, wherein a plurality of contacts is electrically connected to the second doped region.

14 Claims, 5 Drawing Sheets

SEMICONDUCTOR DEVICE FOR ELECTROSTATIC DISCHARGE PROTECTION

BACKGROUND OF THE INVENTION

1. Field of the Invention

The present invention relates to a semiconductor device, and more particular, to a semiconductor device for electrostatic discharge protection.

2. Description of the Prior Art

With the continued miniaturization of integrated circuit (IC) devices, the current trend is to produce integrated circuits having shallower junction depths, thinner gate oxides, lightly-doped drain (LDD) structures, shallow trench isolation (STI) structures, and self-aligned silicide (salicide) processes, all of which are used in advanced sub-quarter-micron CMOS technologies. All of these processes cause the related CMOS IC products to become more susceptible to electrostatic discharge (ESD) damage. Therefore, ESD protection circuits are built onto the chip to protect the devices and circuits of the IC against ESD damage.

Please refer to FIG. 1, which shows a schematic diagram of the electrical circuits having an ESD protection unit. In general, the main circuit 104 can provide various kinds of functions and can be triggered by supplying signals from the input pad 100. However, in some situation, when an ESD current is formed for example, the large ESD current will damage the main circuit 104 or other ESD elements between a power supply site VDD and a grounded site Vss, such as an ESD clamp 103. Thereafter, an ESD protection device 102 is usually provided in the IC. As long as the ESD current is applied, the ESD protection device 102 is turned on to let the ESD current pass through and further to the grounded site Vss, so the current would not damage the main circuit 104 and the ESD clamp 103.

However, current ESD protection device usually has a smaller holding voltage relative to the current voltage of external elements. This makes the IC device easily have a latchup issue or latchup-like issue.

SUMMARY OF THE INVENTION

In order to solve the above-mentioned issues, the present invention therefore provides a semiconductor device for electrostatic discharge (ESD) protection, so as to gain a relative higher holding voltage without increasing the trigger voltage thereof at the same time.

To achieve the purpose described above, the present invention provides a semiconductor device for electrostatic discharge protection, including a first doped well, a gate, a drain region, a second doped well, a first doped region, a second doped region and a source region. The first doped well is disposed in a substrate and has a first conductive type. The gate is disposed on the substrate. The drain region is disposed in the first doped well at a first side of the gate and the drain region has the first conductivity type. The second doped well is disposed in the first doped well at a second side of the gate opposite to the first side and has a second conductivity type complementary to the first conductivity type. The first doped region is disposed in the second doped well and has the second conductivity type. The source region is disposed in the second doped well and has the first conductive type, and the source region surrounds the first doped region from a topview. The second doped region is disposed in the second doped well and has the second conductivity type, and the second doped region is disposed between the gate and the source region, wherein a plurality of contacts is electrically connected to the second doped region.

To achieve the purpose described above, the present invention provides a semiconductor device for electrostatic discharge protection, including a first doped well, a gate, a drain region, a second doped well, a first doped region, a second doped region and a source region. The first doped well is disposed in a substrate and has a first conductive type. The gate is disposed on the substrate. The drain region is disposed in the first doped well at a first side of the gate and the drain region has the first conductivity type. The drain region disposed in the first doped well at a first side of the gate, the drain region has the first conductivity type. The second doped well is disposed in the first doped well at a second side of the gate opposite to the first side and has a second conductivity type complementary to the first conductivity type. The first doped region is disposed in the second doped well and has the second conductivity type. The source region is disposed in the second doped well and has the first conductive type, and the source region surrounds the first doped region from a topview. The second doped region is disposed in the second doped well and has the second conductive type, wherein the second doped region is floating.

According to above, the semiconductor device of the present invention disposes either a dummy P+doped region or a P+ doped region electrically connected to the source region at two sides of the source region to obtain increased holding voltage. Also, although two different current paths are formed through disposing the P-based region electrically connected to the source region, the original current path may obtain the greater resistance, thereto be easily turned on. Thus, the semiconductor device enable to gain increased holding voltage without leading to the increased trigger voltage at the same time. In this way, the holding voltage of a single element maybe sufficiently increased in the present invention. That is, the connected plural elements in a series are no longer used to increase the entire holding voltage and the present invention is therefore beneficial to the minimization of the entire device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 3 are schematic diagrams illustrating a semiconductor device for ESD protection according to a first embodiment of the present invention; wherein FIG. 2 shows a topview of a semiconductor device for ESD protection according to the first embodiment of the present invention; FIG. 3 shows a cross-sectional view taken along a cross line A-A' in FIG. 2.

FIG. 5 to FIG. 6 are schematic diagrams illustrating a semiconductor device for ESD protection according to a third embodiment of the present invention; wherein FIG. 5 shows a topview of a semiconductor device for ESD protection according to the third embodiment of the present invention; FIG. 6 shows a cross-sectional view taken along a cross line B-B' in FIG. 5.

DETAILED DESCRIPTION

To provide a better understanding of the present invention, preferred embodiments will be described in detail. The preferred embodiments of the present invention are illustrated in the accompanying drawings with numbered elements.

Figure 1:
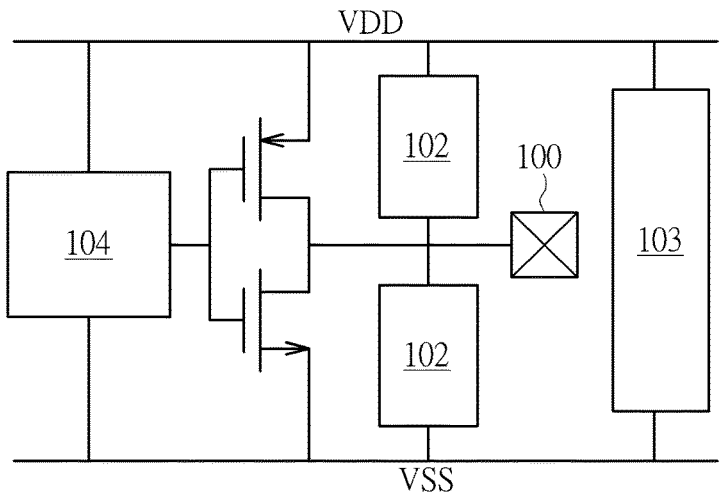
FIG. 1 is a schematic diagram illustrating a conventional electrical circuit having an ESD protection unit.
Figure 2:
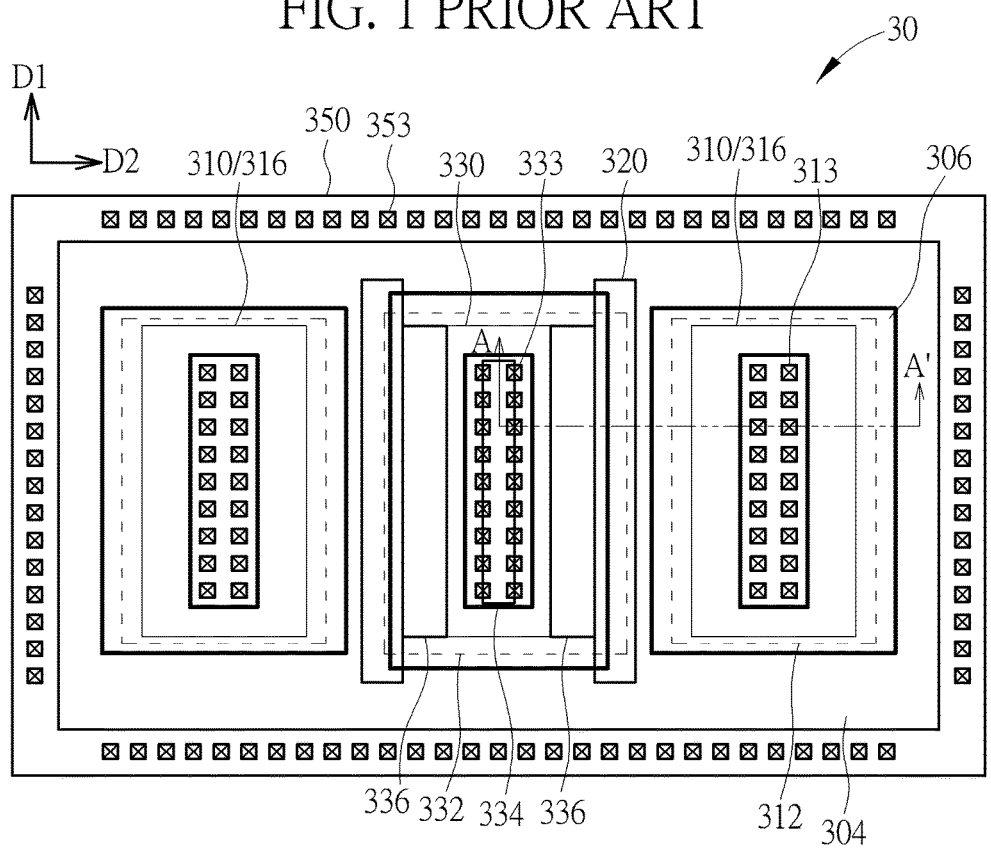
Figure 3:
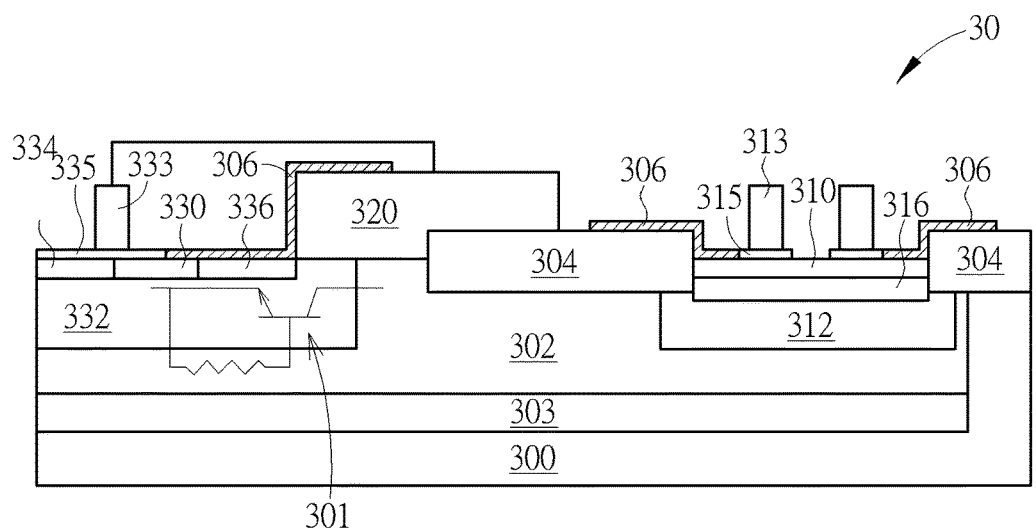

Please refer to FIG. 2 to FIG. 3, which are schematic diagrams illustrating a semiconductor device 30 for ESD protection according to the first embodiment of the present invention, wherein FIG. 2 shows a topview of the semiconductor device 30, and FIG. 3 shows a cross sectional view taken along the cross line A-A' in FIG. 2. The semiconductor device 30 for ESD protection includes a substrate 300, a deep doped well 302 such as a HVDNW, a drain region 310, a source region 330, a doped well 332, a doped region 334 and a guard ring 350 disposed in the substrate 300, and a gate 320 across the substrate 300 between the drain region 310 and the source region 330. The substrate 300 for example includes a silicon containing substrate, epitaxial silicon substrate or silicon-on-insulator (SOI) substrate, but is not limited thereto.

In the present embodiment, the deep doped well 302 has a first conductive type, such as N type, while the substrate 300 has a second conductive type which is complementary to the first conductive type, such as P type. The drain region 310 and the source region 330 also have the first conductive type such as N type. However, the conductive types of the drain region 310, the source region 330 and the deep doped well 302 are not limited thereto, and in other embodiments, the first conductive type and the second conductive type may be swapped. The drain region 310 and the source region 330 are disposed in the deep doped well 302 and preferably not in contact with the substrate 300 directly. That is, the deep doped well 302 may surround the drain region 310 and the source region 330 from a topview (not shown in the drawings). In one embodiment, an N-type buried layer (NBL) 303 may be formed between the deep doped well 302 and the substrate 300 for avoiding punch-through effects.

As shown in FIG. 2, the source region 330 is disposed between two drain regions 310, and two gates 320 cross over the substrate 300 between two opposite sides of the source region 330 and the two drain regions 310 respectively. In the present embodiment, the source region 330 and the two drain regions 310 are both in a stripe-like-shape and arranged in parallel one with another along a first direction D1, such as a y direction. However, in another embodiment, the source region and the drain region may also have different shapes such as a circular shape. Furthermore, the guard ring 350 has the second conductive type such as P type, and the doped concentration thereof is greater than that of the substrate 300. In the present embodiment, the guard ring 350 has two first part extending along the first direction D1 (such as the y-direction) and two second part extending along a second direction D2 different from the first direction D1 (such as the x-direction). That is, the two drain regions 310, the two gates 320 and the source region 330 are all surrounded by the guard region 350 from a topview shown in FIG. 2. Also, at least one contact plug such as contact plugs 353 are formed on the guard ring 350 for electrical connecting thereto.

The semiconductor device 30 further include an isolation structure 304, such as a shallow trench isolation (STI) or a field oxide (FOX), disposed in the substrate 300 for electric isolation. For example, through the topview shown in FIG. 2, the isolation structure 304 surrounds the source region 330 and the two drain regions 310, and the guard ring 350 is disposed outside the isolation structure 304 to further surround the isolation structure 304. On the other hand, through the cross-sectional view shown in FIG. 3, two portions of the isolation structure 304 are shown at two sides of the drain region 310, and one portion of them is disposed in the deep doped well 302 with a part thereof overlapping underneath with the gate 320.

Precisely speaking, the drain region 310 is further disposed in a doped well 312 having the first conductive type, such as N type, and a doped concentration of the doped well 312 is greater than a doped concentration of the deep doped well 302 and is smaller than a doped concentration of the drain region 310. For example, in one embodiment, the doped concentration of the deep doped well 302 may be between about $10^{14}$ and $10^{16}$ cm$^{-3}$, the doped concentration of the doped well 312 may be between about $10^{16}$ and $10^{17}$ cm$^{-3}$, and the doped concentration of the drain region 310 may be between about $10^{19}$ and $10^{21}$ cm$^{-3}$, but not limited thereto. In one embodiment, a doped region such as a P-type ESD (PESD) region 316 is formed between the drain region 310 and the doped well 312, as shown in FIG. 3. Also, at least one contact plug such as contact plugs 313 are formed on the drain region 310 for electrical connecting thereto. In one embodiment, a silicide blocking (SAB) layer 306 as shown in FIG. 2 is disposed on the substrate 300 to expose partial surfaces thereof, and the contact plugs 313 are disposed on a silicide layer 315 which is formed on such exposed surfaces of the drain region 310, as shown in FIG. 3.

It is noteworthy that, the source region 330 is further disposed in a doped well 332 having the second conductive type (such as P type), and a doped region 334 and a doped region 336 both having the second conductive type (such as P type) are also disposed in the doped well 332 at two sides of the source region 330. In the present embodiment, the doped region 334 and the source region 330 are disposed between two doped regions 336, and the doped region 334 is namely surrounded by the source region 330 from a topview shown in FIG. 2. Also, the doped region 334 and the two doped regions 336 may both include a stripe-like-shape and are arranged in parallel with the source region 330 along the first direction D1, and the doped regions 336 preferably have a greater length than the doped region 334 in the first direction D1. However, in other embodiments, two sides of the two doped region 336 may further in contact with each other to from a rectangular ring-shaped doped region (not shown in the drawings) to surround the stripe-shaped doped region 334 from a topview (not shown in the drawings) with the rectangular ring-shaped doped region not in contact with the doped region 334, or in the embodiment including the circular shaped drain region and the source region, those doped regions may also be circular shaped as well. Doped concentrations of the doped region 334 and the doped region 336 are preferably the same, but greater than that of the doped well 332. For example, in one embodiment, the doped concentration of the doped wells 332 may be between about $10^{16}$ and $10^{17}$ cm$^{-3}$, and the doped concentrations of the doped regions 334, 336 may be between about $10^{18}$ and $10^{19}$ cm$^{-3}$, but not limited thereto. Also, a doped concentration of the source region 330 is preferably the same to the doped concentration of the drain regions 310.

It is also noted that, at least one contact plug such as contact plugs 333 are formed on the source region 330 along the first direction D1 for electrical connecting thereto. The contact plugs 333 are disposed at a boundary between the source region 330 and the doped region 334, on a silicide layer 335 which is formed on such exposed surfaces of the source region 330, as shown in FIG. 3. That is, the source region 330 and the doped region 334 are electrically connected with each other, and also further connect to the gate 320 through the contact plugs 333. On the other hand, since the SAB layer 306 covers the doped regions 336, there is no silicide layer and no contact plug being formed on the doped region 336. Thus, the doped region 336 is therefore a floating structure, and which is not allowed to connect any external input/output terminals (not shown in the drawings).

Through above arrangements, the deep doped well 302, the doped well 332 and the source region 330 of the semiconductor device 30 may together form a parasitic NPN bipolar junction transistor (BJT) 301, in which the deep doped well 302 is configured as a collector of the parasitic NPN BJT 301, the doped well 332 is configured as a base of the parasitic NPN BJT 301 and the source region 330 is configured as an emitter of the parasitic NPN BJT 301, as shown in FIG. 3. In this manner, if a large ESD current is supplied to a high voltage power site, the ESD current may turn on the parasitic NPN BJT 301 and the ESD current may subsequently flow through the deep doped well 302 , the doped well 332 and the source region 330 and finally to a low voltage power site (not shown in the drawings) such as a ground terminal, thereby avoiding the ESD current to damage the main circuit. According to the semiconductor device 30 in the present invention, the doped region 336 having the same conductive type and greater doped concentration related to the doped well 332 is additionally disposed in the doped well 332 between the source region 330 and the deep doped well 302 so as to decrease current gain of the parasitic NPN BJT 301. That is, the holding voltage of the parasitic NPN BJT 301 is therefore increased, and the ESD tolerance of the semiconductor device 30 of the present embodiment is improved accordingly. For example, the holding voltage of the semiconductor device 30 may increase to about 9V to 11V. Also, the increasing of the holding voltage is positive relative to the length of the doped region 336 in the second direction D2.

The following description will detail the different embodiments of the ESD protection device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 4:
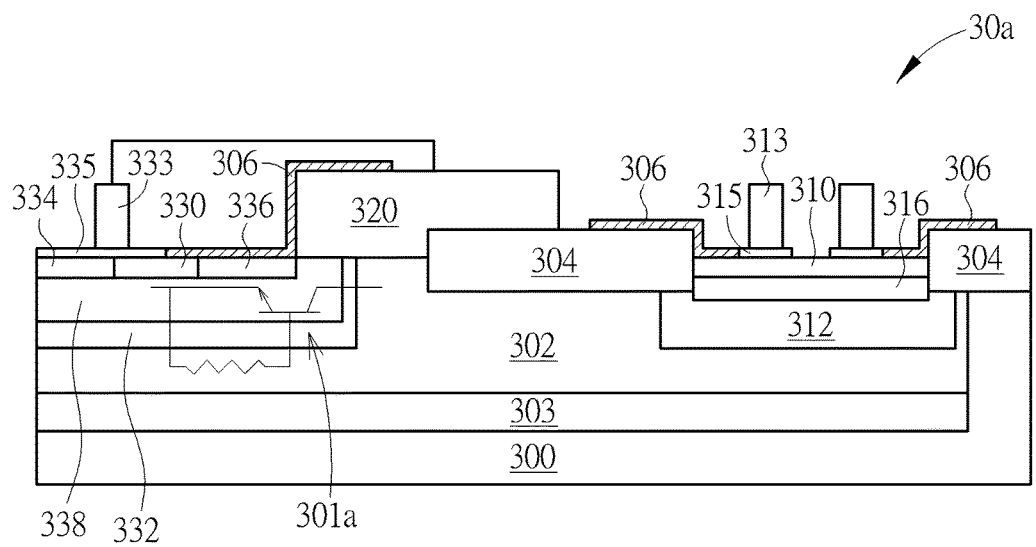
FIG. 4 is a schematic diagram of a cross-sectional view of a semiconductor device for ESD protection according to a second embodiment of the present invention.

Please refer to FIG. 4, which show a schematic diagram of a semiconductor device for ESD protection 30a according to the second embodiment of the present invention. The semiconductor device 30a of the present embodiment is substantially similar to that of the semiconductor device 30 in above embodiment, and which includes the substrate 300, the deep doped well 302, the drain region 310, the source region 330, the doped region 334, the doped region 336 and a guard ring 350 disposed in the substrate 300, and the gate 320 across the substrate 300 between the drain region 310 and the source region 330. The aforementioned elements are substantially similar to those in the semiconductor device 30 of the above embodiment, and will not be redundantly described herein.

As shown in FIG. 4, the difference between the semiconductor device 30a and the semiconductor device 30 is in that a doped region such as a P-base region 338 is additionally disposed in the doped well 332 under the doped regions 334, 336 and the source region 330. Precisely, the doped regions 334, 336 and the source region 330 are all disposed in the P-base region 338 and preferably not in contact with the doped well 332. That is, the P-base region 338 may surround the doped regions 334, 336 and the source region 330 from a topview (not shown in the drawings). In the present embodiment, the P-base region 338 has a doped concentration which is greater than that of the doped well 332, and is smaller than that of the doped regions 334, 336. For example, in one embodiment, the doped concentration of the doped wells 332 may be between about $10^{16}$ and $10^{17}$ cm$^{-3}$, the doped concentration of the P-base region 338 may between about $10^{17}$ and $10^{18}$ cm$^{-3}$, and the doped concentrations of the doped regions 334, 336 may between about $10^{18}$ to $10^{19}$ cm$^{-3}$, but not limited thereto.

Through above arrangements, the deep doped well 302, the doped well 332 (including the P-base region 338) and the source region 330 of the semiconductor device 30a together form a parasitic NPN bipolar BJT 301a shown in FIG. 4, for driving the ESD current flowing through the deep doped well 302, the doped well 332 (including the P-base region 338) and the source region 330 and finally to the low voltage power site. According to the semiconductor device 30a in the present invention, the P-base region 338 having the same conductive type and greater doped concentration related to the doped well 332 is additionally disposed in the doped well 332 between the doped regions 334, 336 and the deep doped well 302, so as to further decrease current gain of the parasitic NPN BJT 301a. That is, the holding voltage of the parasitic NPN BJT 301a is therefore further increased, and the ESD tolerance of the semiconductor device 30a of the present embodiment is improved accordingly. For example, the holding voltage of the semiconductor device 30a may increase to about 25V to 27V.

Figure 5:
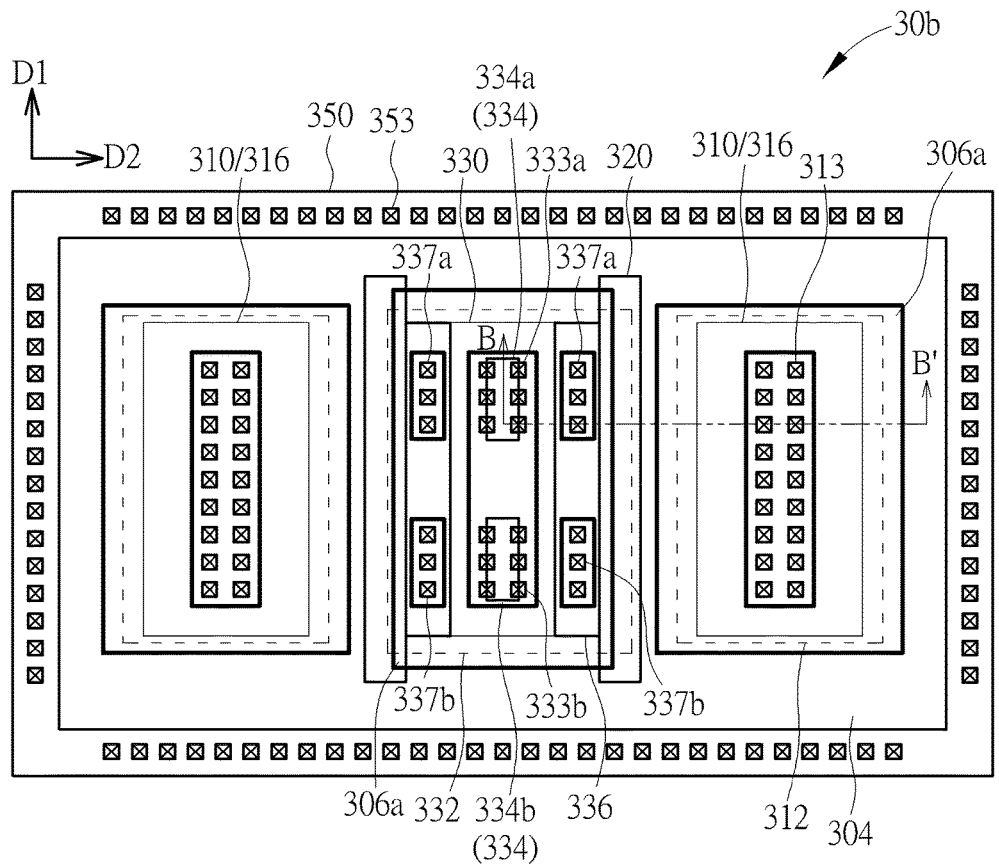
Figure 6:
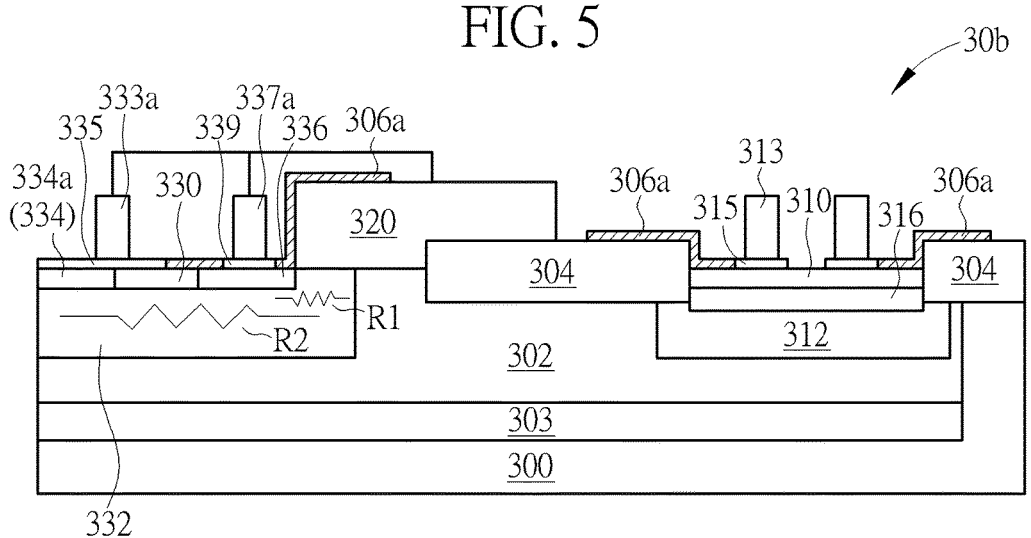

Please refer to FIGS. 5-6, which show a schematic diagram of a semiconductor device for ESD protection 30b according to the third embodiment of the present invention. The semiconductor device 30b of the present embodiment is substantially similar to that of the semiconductor device 30 in above embodiment, and which includes the substrate 300, the deep doped well 302, the drain region 310, the source region 330, the doped region 334, the doped region 336 and a guard ring 350 disposed in the substrate 300, and the gate 320 across the substrate 300 between the drain region 310 and the source region 330.

As shown in FIGS. 5-6, the differences between the semiconductor device 30b and the semiconductor device 30 is in that the doped region 334 of the present embodiment includes two separated parts 334a, 334b and the doped region 336 is not floating. The two parts of the doped region 334a, 334b both include a stripe-like-shape and are arranged in parallel with the source region 330 along the first direction D1, and the two parts of the doped region 334a, 334b are closed to the two second parts of the guard ring 350 respectively. Also, at least one contact plug such as contact plugs 333a and contact plugs 333b are respectively formed on the boundaries between the source region 330 and the two parts of the doped region 334a, 334b for electrical connecting the source region 330 and the doped region 334. The contact plugs 333a, 333b are disposed on a silicide layer 335 which is formed on exposed surfaces of the source region 330 as shown in FIG. 5. That is, the source region 330 and the doped region 334 are electrically connected with each other, and also further connect to the gate 320 through the contact plugs 333a, 333b.

Furthermore, at least one contact plug such as contact plugs 337a and contact plugs 337b are separated disposed on each doped region 336, wherein the contact plugs 337a and the contact plugs are disposed on two side portions which are closed to the two second parts of the guard ring 350 respectively, as shown in FIG. 5. In other words, a SAB layer 306a of the present embodiment is disposed on the substrate 300 to further expose two opposite edge surfaces of each doped region 336, such that, the contact plugs 337a, 337b are disposed on a silicide layer 339 which is formed on such exposed surfaces of each doped region 336, as shown in FIG. 6. Thus, the doped region 336 of the present embodiment may be electrically connected to the source region 330, the doped region 334 and the gate 320 through the contact plugs 337a, 337b.

Through above arrangements, the deep doped well 302, the doped well 332 and the source region 330 of the semiconductor device 30b also together form a parasitic NPN bipolar BJT (not shown in the drawings), for driving the ESD current to the low voltage power site. Also, since the contact plugs 337a, 337b are formed to electrically connect the doped region 336 to the source region 330 and the gate 320, an addition current path is formed between the deep doped well 302, the doped well 332 and the doped region 336. That is, the original current path flowed through the deep doped well 302, the doped well 332 and the source region 330 may become difficult to be conducted. Thus, the holding voltage of the parasitic NPN BJT in the present embodiment is therefore increased dramatically, and the ESD tolerance of the semiconductor device 30b of the present embodiment is also improved accordingly. For example, the holding voltage of the semiconductor device 30b may increase to about 27V to 29V.

Figure 7:
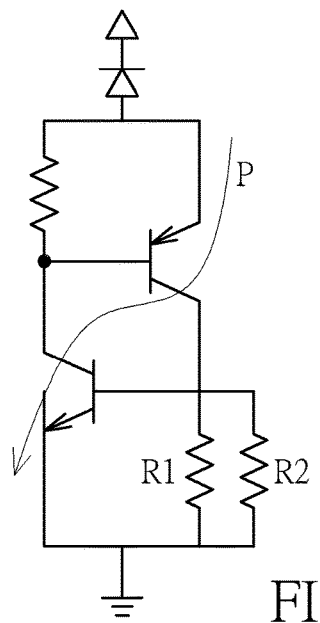
FIG. 7 is a schematic circuit diagram of a semiconductor device for ESD protection according to the third embodiment of the present invention.

Next, further according to the present embodiment, two resistances R1, R2 as shown in FIGS. 6 and 7 are generated by two current paths for tuning the trigger voltage and the holding voltage respectively. In the present embodiment, the resistance R2 is greater than the resistances R1, and which may induce greater voltage difference. That is, the original current path P may be fast turn on as shown in FIG. 7, thereto avoid the trigger voltage of the semiconductor device 30b being increased while the holding voltage is increased. In other words, the semiconductor device 30b of the present embodiment enables to gain the increased holding voltage without leading to increased trigger voltage at the same time. For example, the triggering voltage of the semiconductor device 30b may be kept at about 3V to 5V while the holding voltage is increased to about 27V to 29V.

Figure 8:
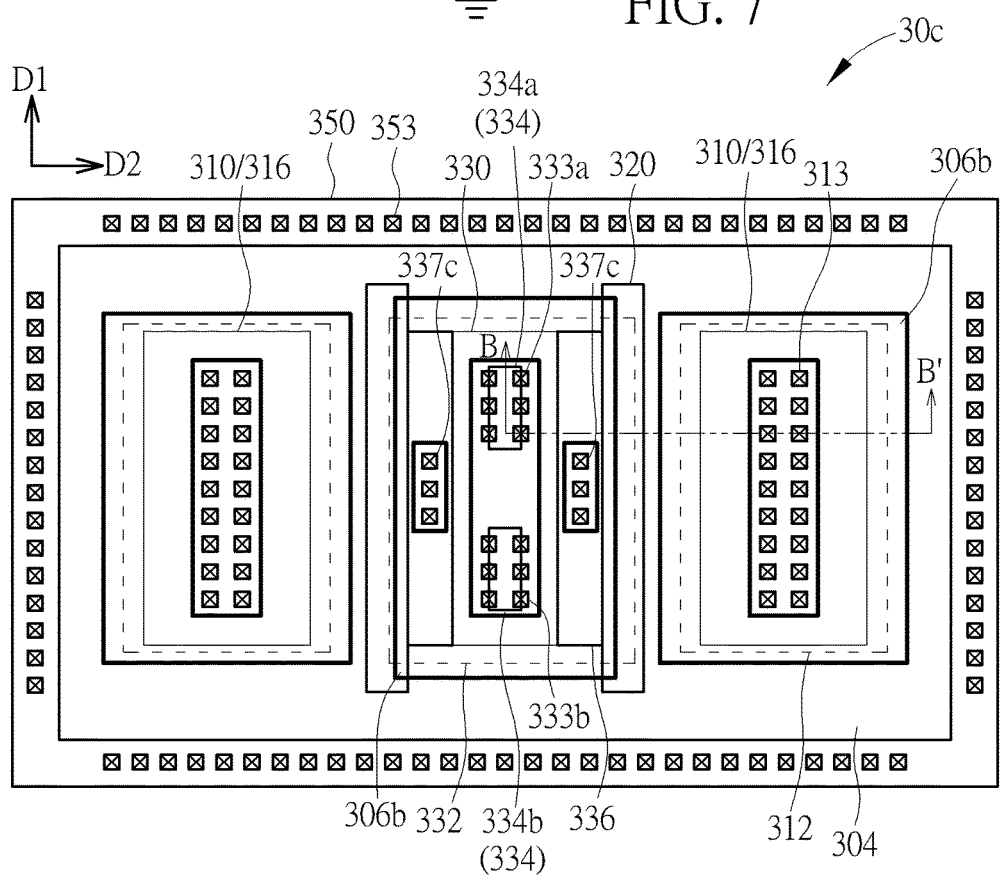
FIG. 8 is a schematic diagram of a topview of a semiconductor device for ESD protection according to a fourth embodiment of the present invention.

Please refer to FIG. 8, which shows a schematic diagram of a semiconductor device for ESD protection 30c according to the fourth embodiment of the present invention. The semiconductor device 30c of the present embodiment is substantially similar to that of the semiconductor device 30b in above embodiment, and which includes the substrate 300, the deep doped well 302, the drain region 310, the source region 330, the two parts of the doped regions 334a, 334b, the doped region 336 and a guard ring 350 disposed in the substrate 300, and the gate 320 across the substrate 300 between the drain region 310 and the source region 330.

As shown in FIG. 8, the difference between the semiconductor device 30c and the semiconductor device 30b is in that at least one contact plug such as contact plugs 337c are disposed on a middle portion of each doped region 336, and the middle portions of the doped regions 336 is between the two second parts of the guard ring 350 as shown in FIG. 8. In other words, a SAB layer 306b of the present embodiment is disposed on the substrate 300 to further expose middle surfaces on each doped region 336, such that, the contact plugs 337c are formed on a silicide layer (not shown in the drawings) which is formed on such exposed surfaces of each doped region 336. That is, the source region 330 and the doped regions 334, 336 may be electrically connected to each other and further connect to the gate 320 through the contact plugs 333a, 333b, 337c in the present embodiment.

Through above arrangement, the addition current path is still formed between the deep doped well 302, the doped well 332 and the doped region 336. Also, since the contact plugs 337c are disposed in the middle portion of the doped region 336, and the number of the contact plugs 337c is less than that of the contact plug 337a, 337b in the above embodiment, the original current path flowed through the deep doped well 302, the doped well 332 and the source region 330 may become more difficult to be conducted, thereto further increased the holding voltage of the semiconductor device 30c. For example, the holding voltage of the semiconductor device 30c may increase to about 29V to 31V. Furthermore, in the present embodiment, two different resistances (not shown in the drawings) are still generated by two current paths for tuning the trigger voltage and the holding voltage respectively, and the original current path has the relative greater resistance. That is, the original current path of the present embodiment may be fast turn on, thereto avoid the trigger voltage of the semiconductor device 30c being increased while the holding voltage is increased. In other words, the semiconductor device 30c of the present embodiment also enables to gain the further increased holding voltage without leading to an increased trigger voltage at the same time.

Figure 9:
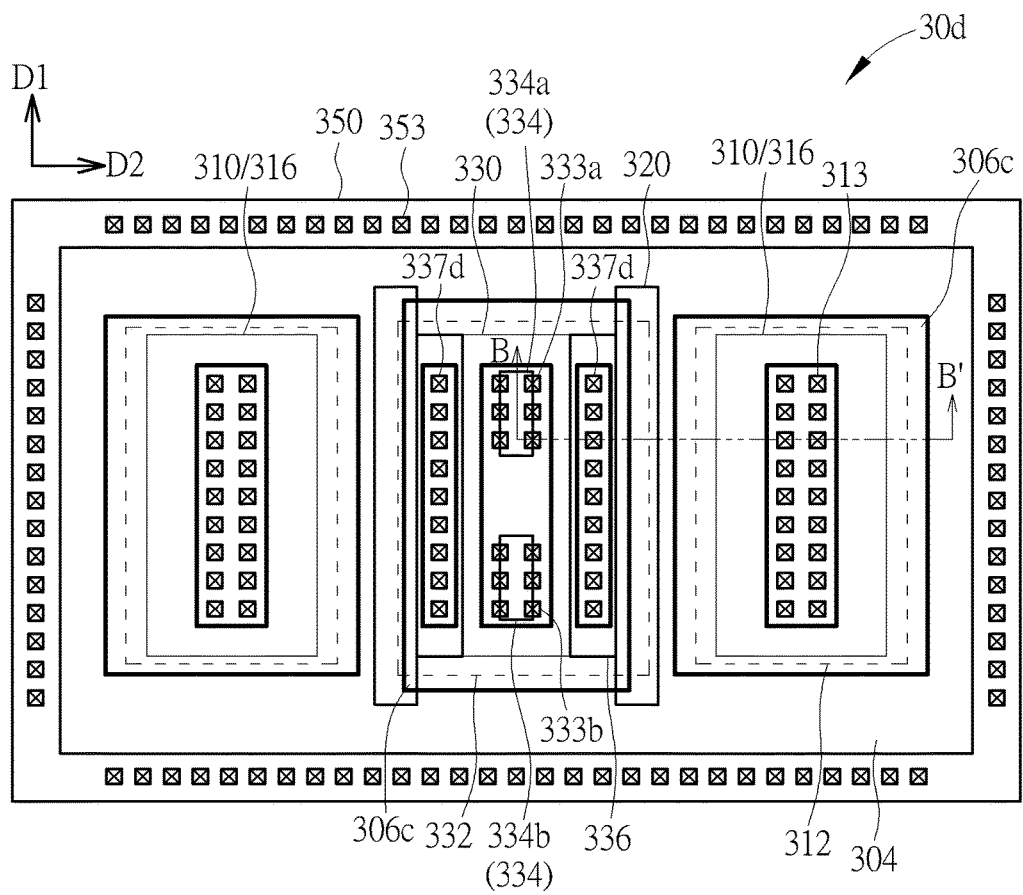
FIG. 9 is a schematic diagram of a topview of a semiconductor device for ESD protection according to a fifth embodiment of the present invention.

Please refer to FIG. 9, which shows a schematic diagram of a semiconductor device for ESD protection 30d according to the fifth embodiment of the present invention. The semiconductor device 30d of the present embodiment is substantially similar to that of the semiconductor device 30b in above embodiment, and which includes the substrate 300, the deep doped well 302, the drain region 310, the source region 330, the two parts of the doped regions 334a, 334b, the doped region 336 and a guard ring 350 disposed in the substrate 300, and the gate 320 across the substrate 300 between the drain region 310 and the source region 330.

As shown in FIG. 9, the difference between the semiconductor device 30c and the semiconductor device 30b is in that at least one contact plug such as contact plugs 337d are uniformly disposed among each doped region 336. In other words, a SAB layer 306c of the present embodiment is disposed on the substrate 300 to expose entire surfaces of each doped region 336, such that, the contact plugs 337d are formed on a silicide layer (not shown in the drawings) which is formed over the entire doped region 336. That is, the source region 330 and the doped regions 334, 336 may be electrically connected to each other and further connect to the gate 320 through the contact plugs 333a, 333b, 337d in the present embodiment. Through above arrangement, the semiconductor device 30d of the present embodiment also enables to gain the further increased holding voltage without leading to an increased trigger voltage at the same time.

Figure 10:
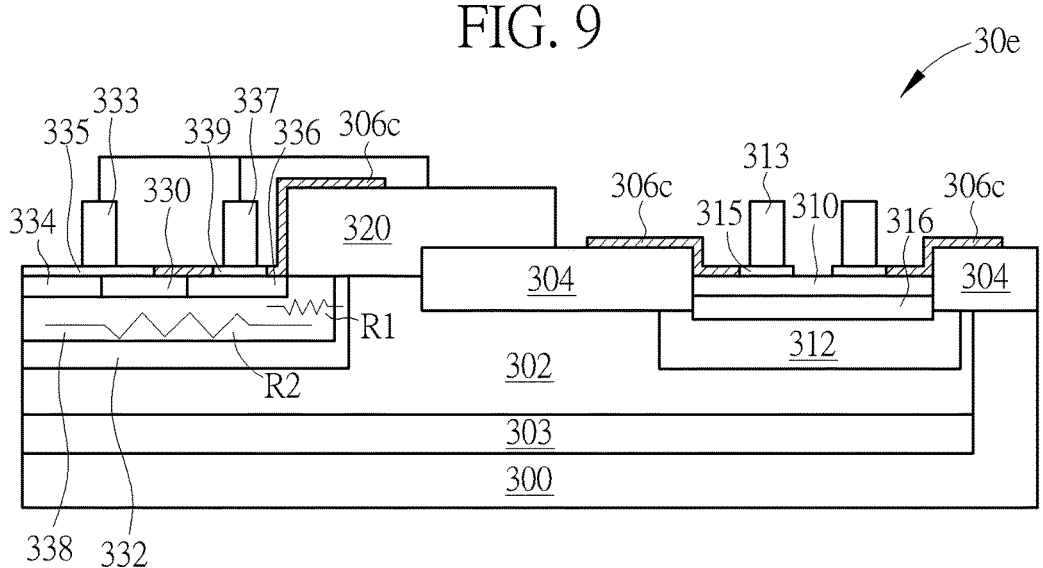
FIG. 10 is a schematic diagram of a cross-sectional view of a semiconductor device for ESD protection according to a sixth embodiment of the present invention.

Please refer to FIG. 10, which show a schematic diagram of a semiconductor device for ESD protection 30e according to the sixth embodiment of the present invention. The semiconductor device 30e of the present embodiment is substantially similar to that of the semiconductor device 30b in above embodiment, and which includes the substrate 300, the deep doped well 302, the drain region 310, the source region 330, the two parts of the doped region 334, the doped region 336 and a guard ring 350 disposed in the substrate 300, and the gate 320 across the substrate 300 between the drain region 310 and the source region 330.

As shown in FIG. 10, the difference between the semiconductor device 30e and the semiconductor device 30b is in that a doped region such as a P-base region 338 is additionally disposed in the doped well 332 under the doped regions 334, 336 and the source region 330. Precisely, the doped regions 334, 336 and the source region 330 are all disposed in the P-base region 338 and preferably not in contact with the doped well 332. That is, the P-base region 338 may surround the doped regions 334, 336 and the source region 330 from a topview (not shown in the drawings). In the present embodiment, the P-base region 338 has a doped concentration which is greater than that of the doped well 332 but is smaller than that of the doped regions 334, 336. For example, in one embodiment, the doped concentration of the doped wells 332 may be between about $10^{16}$ and $10^{17}$ cm$^{-3}$, the doped concentration of the P-base region 338 may between about $10^{17}$ and $10^{18}$ cm$^{-3}$, and the doped concentrations of the doped regions 334, 336 may between about $10^{18}$ to $10^{19}$ cm$^{-3}$, but not limited thereto.

According to the semiconductor device 30e in the present invention, the P-base region 338 having the same conductive type and greater doped concentration related to the doped well 332 is additionally disposed in the doped well 332 between the doped regions 334, 336 and the deep doped well 302 so as to decrease current gain of the parasitic NPN BJT (not shown in the drawings). That is, the holding voltage of the parasitic NPN BJT is therefore further increased, and the ESD tolerance of the semiconductor device 30e of the present embodiment is improved accordingly.

Overall, the semiconductor device for ESD protection further disposes either a dummy P+ doped region or a P+ doped region electrically connected to the source region at two sides of the source region to obtain increased holding voltage. Also, although two different current paths are formed through disposing the P-based region electrically connected to the source region, the original current path may obtain the greater resistance, thereto be easily turned on. Thus, the semiconductor device enable to gain increased holding voltage without leading to the increased trigger voltage at the same time. In this way, the holding voltage of a single element may be sufficiently increased in the present invention. That is, it no longer uses connected plural elements in a series to increase the entire holding voltage and the present invention is therefore beneficial to the minimization of the entire device.

It is well known in the arts, although the semiconductor devices in the aforementioned embodiments are all exemplified by having a parasitic NPN BJT, the present invention is not limited thereto. The first conductive type and the second conductive type may be swapped in other embodiments. For example, the first conductive type can be P type and the second conductive type can be N type, and the semiconductor device may include a parasitic PNP BJT or other type of diode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device for ESD protection, comprising:
   a first doped well disposed in a substrate and having a first conductive type;
   a gate disposed on the substrate;
   a drain region disposed in the first doped well at a first side of the gate, the drain region comprising the first conductivity type;
   a second doped well disposed in the first doped well at a second side of the gate opposite to the first side and having a second conductivity type complementary to the first conductivity type;
   a first doped region disposed in the second doped well and having the second conductivity type;
   a source region disposed in the second doped well and having the first conductive type, the source region surrounding the first doped region from a topview; and
   a second doped region disposed in the second doped well and having the second conductive type, the gate, the first doped region, the second doped region and the source region being extended along a first direction, the second doped region disposed between the gate and the source region, and between the source region and the drain region, wherein a plurality of contacts is electrically connected to the second doped region.

2. The semiconductor device for ESD protection according to claim 1, wherein the contacts are disposed in a middle portion of the second doped region.

3. The semiconductor device for ESD protection according to claim 1, wherein the contacts are disposed at two side portions of the second doped region.

4. The semiconductor device for ESD protection according to claim 1, wherein the contacts are uniformly disposed among the whole second doped region.

5. The semiconductor device for ESD protection according to claim 1, further comprising:
   another second doped region disposed in the second doped well and having the second conductive type, the source region and the first doped region both disposed between the two second doped regions.

6. The semiconductor device for ESD protection according to claim 1, wherein the first doped region comprises two separated parts and the source region surrounds the two separated parts from the topview.

7. The semiconductor device for ESD protection according to claim 1, further comprising:
   a third doped region having the second conductive type, and the first doped region, the second doped region and the source region all disposed in the third doped region.

8. The semiconductor device for ESD protection according to claim 1, wherein the first doped region and the source region are both electrically connected to the gate.

9. The semiconductor device for ESD protection according to claim 1, further comprising a third doped well disposed in the first doped well and having the first conductivity type, wherein the drain region is disposed in the third doped well.

10. The semiconductor device for ESD protection according to claim 1, further comprising a first isolation structure formed in the substrate, and the gate overlapping a portion of the first isolation structure.

11. The semiconductor device for ESD protection according to claim 10, further comprising:
   a second isolation structure, the drain region being in between the first isolation structure and the second isolation structure, and in contact with the first isolation structure and the second isolation structure.

12. The semiconductor device for ESD protection according to claim 9, further comprising:
   a fourth doped region disposed in the third doped well under the drain region, the fourth doped region having the second conductive type and overlapping the drain region.

13. The semiconductor device for ESD protection according to claim 1, further comprising:
   another drain region disposed in the first doped well and having the first conductivity type, wherein the source region is disposed between the two drain regions; and
   another gate disposed on the substrate, wherein the source region is disposed between the two gates.

14. The semiconductor device for ESD protection according to claim 13, further comprising: a guard ring disposed in the substrate and having the second conductive type, the guard ring surrounded the two drain regions, the source region and the two gates, wherein the guard ring comprises a first portion extending along the first direction and a second portion extending along a second direction different from the first direction.

* * * * *